United States Patent
Torregrosa et al.

(10) Patent No.: US 10,923,325 B2
(45) Date of Patent: Feb. 16, 2021

(54) METHOD OF CONTROLLING AN IMPLANTER OPERATING IN PLASMA IMMERSION

(71) Applicant: ION BEAM SERVICES, Peynier (FR)

(72) Inventors: Frank Gilbert Torregrosa, Simiane (FR); Laurent Roux, Marseilles (FR)

(73) Assignee: ION BEAM SERVICES, Peynier (FR)

( * ) Notice: Subject to any disclaimer, the term of this patent is extended or adjusted under 35 U.S.C. 154(b) by 320 days.

(21) Appl. No.: 16/060,700

(22) PCT Filed: Dec. 5, 2016

(86) PCT No.: PCT/FR2016/000198
§ 371 (c)(1),
(2) Date: Jun. 8, 2018

(87) PCT Pub. No.: WO2017/098092
PCT Pub. Date: Jun. 15, 2017

(65) Prior Publication Data
US 2018/0358207 A1    Dec. 13, 2018

(30) Foreign Application Priority Data
Dec. 10, 2015  (FR) ..................... 15 02569

(51) Int. Cl.
*H01J 37/32* (2006.01)
*C23C 14/48* (2006.01)
(Continued)

(52) U.S. Cl.
CPC ........ *H01J 37/32412* (2013.01); *C23C 14/48* (2013.01); *H01J 37/026* (2013.01);
(Continued)

(58) Field of Classification Search
None
See application file for complete search history.

(56) References Cited

U.S. PATENT DOCUMENTS 6,237,527 B1 *  5/2001  Kellerman ........ H01J 37/32412
                                                    118/723 E
8,461,554 B1    6/2013  Kurunczi et al.
(Continued)

FOREIGN PATENT DOCUMENTS

FR    2 998 707 A1    5/2014
JP    10-142400 A     5/1998
(Continued)

OTHER PUBLICATIONS

International Search Report for PCT/FR2016/000198, dated Mar. 31, 2017.

*Primary Examiner* — Crystal L Hammond
(74) *Attorney, Agent, or Firm* — Sughrue Mion, PLLC

(57) ABSTRACT

A method of controlling an implanter operating in plasma immersion, the method including the steps of:
- an implantation stage (1) during which the plasma AP is ignited and the substrate is negatively biased S;
- a neutralization stage (2) during which the plasma AP is ignited and the substrate has a positive or zero bias S applied thereto;
- a suppression stage (3) during which the plasma AP is extinguished; and
- an expulsion stage (4) for expelling negatively charged particles from the substrate and during which the plasma AP is extinguished.

The method is remarkable in that the duration of the expulsion stage is longer than 5 μs.

The invention also provides a power supply for biasing an implanter.

5 Claims, 3 Drawing Sheets

(51) Int. Cl.
*H01J 37/317* (2006.01)
*H01J 37/02* (2006.01)
*H01L 21/223* (2006.01)

(52) U.S. Cl.
CPC .... *H01J 37/3171* (2013.01); *H01J 37/32174* (2013.01); *H01J 37/32357* (2013.01); *H01J 37/32422* (2013.01); *H01J 37/32706* (2013.01); *H01J 37/32871* (2013.01); *H01J 2237/0044* (2013.01); *H01L 21/2236* (2013.01)

(56) References Cited

U.S. PATENT DOCUMENTS

| | | | |
|---|---|---|---|
| 9,552,962 B2* | 1/2017 | Torregrosa | H01J 37/3171 |
| 2007/0069157 A1 | 3/2007 | Mehta et al. | |
| 2012/0217221 A1* | 8/2012 | Hoffman | C23C 14/345 |
| | | | 216/61 |
| 2014/0062495 A1* | 3/2014 | Carter | H01J 37/32944 |
| | | | 324/459 |
| 2014/0353525 A1* | 12/2014 | Torregrosa | H01J 37/32917 |
| | | | 250/492.3 |

FOREIGN PATENT DOCUMENTS

| | | |
|---|---|---|
| WO | 01/15200 A1 | 3/2001 |
| WO | 02/25694 A2 | 3/2002 |
| WO | 2012/168575 A2 | 12/2012 |
| WO | 2013/057390 A1 | 4/2013 |

* cited by examiner

METHOD OF CONTROLLING AN IMPLANTER OPERATING IN PLASMA IMMERSION

CROSS-REFERENCE TO RELATED APPLICATIONS

This application is a National Stage of International Application No. PCT/FR2016/000198, filed on Dec. 5, 2016, which claims priority from French Patent Application No. 15/02569, filed on Dec. 10, 2015, the disclosures of which are incorporated by reference herein.

BACKGROUND OF THE INVENTION

The present invention relates to a method of controlling an implanter operating in plasma immersion.

The field of the invention is that of ion implanters operating in plasma immersion mode. Thus, implanting ions in a substrate consists in immersing the substrate in a plasma and in biasing it with a negative voltage lying in the range a few tens of volts to a few tens of kilovolts (generally less than 100 kV) in order to create an electric field capable of accelerating the ions of the plasma towards the substrate so that they become implanted therein. The atoms implanted in this way are referred to as dopants.

The penetration depth of the ions is determined by their acceleration energy. It depends firstly on the voltage applied to the substrate and secondly on the respective natures of the ions and of the substrate. The concentration of implanted atoms depends on the dose, which is expressed as a number of ions per square centimeter ($cm^2$), and also on the implantation depth.

For reasons associated with the physics of plasmas, an ion sheath is created around the substrate a few nanoseconds after the voltage is applied. The potential difference that is responsible for accelerating ions towards the substrate is thus located at the boundaries of the sheath.

The increase in size of this sheath as a function of time follows the Child-Langmuir equation:

$$j_c = \frac{4}{9}\varepsilon_0 \left(\frac{2e}{M}\right)^{1/2} \frac{V_0^{3/2}}{S^2}$$

where:
$j_c$: current density;
$\varepsilon_0$: vacuum permittivity;
$\underline{e}$: ion charge;
$\underline{M}$: ion mass;
$V_0$: potential difference across the sheath; and
$\underline{s}$: thickness of the sheath.

By stipulating that the current density is equal to the charge passing through the boundary of the sheath per unit time, ds/dt represents the travel speed of this boundary:

$$\frac{ds}{dt} = \frac{2}{9}\frac{S_0^2 \cdot u_0}{S^2}$$

In which expression $s_0$ is given by:

$$s_0 = \left(\frac{2\varepsilon_0 V_0}{e \cdot n_0}\right)^{1/2}$$

it being understood that $u_0 = (2\ eV_0/M)$ is the characteristic speed of the ion and that $n_0$ is the density of the plasma.

The thickness of the sheath is associated mainly with the applied voltage, with the density of the plasma, and with the mass of the ions.

The equivalent impedance of the plasma, which determines the implantation current, is directly proportional to the square of the thickness of the sheath. The implantation current thus decreases very quickly as the sheath increases in size.

After a certain time lapse, it is necessary to proceed with reinitialization. This is found to be practically unavoidable once the sheath reaches the walls of the enclosure, thus stopping the implantation mechanism.

In order to reinitialize the system, it is therefore common practice to stop the high voltage on the substrate while keeping the plasma ignited. It is thus necessary to have a pulse generator that produces high voltage pulses.

Thus, with reference to FIG. 1, document WO 01/15200 proposes biasing the substrate by means of a power supply that comprises:
a generator GEN having its positive pole connected to ground;
a capacitor Ct in parallel with the generator GEN;
a first switch IT1 having its first pole connected to the negative pole of the generator GEN, and having its second pole connected to the output terminal O of the power supply; and
a second switch IT2 having its first pole connected to the output terminal O, and having its second pole connected to ground.

The method comprises the following stages:
an implantation stage during which:
the plasma power supply is activated;
the first switch IT1 is closed; and
the second switch IT2 is open; and
a neutralization stage during which:
the first switch IT1 is open; and
the second switch IT2 is closed.

The continued presence of the plasma in the enclosure gives rise to undesirable side effects:
generating particles or dust;
delivering heat to the substrate;
attacking the enclosure, leading to risks of metal contamination of the treated parts;
creating charge effects, which are particularly troublesome for microelectronic applications; and
implanting at an acceleration voltage that is not stabilized during the stages in which the voltage applied to the substrate is rising and falling.

In addition, document US 2007/069157 provides for the following succession of operations:
activating the power supply of the substrate;
after a certain delay, activating the power supply of the plasma for the duration of one pulse;
deactivating the power supply of the plasma; and
after a certain period, deactivating the power supply of the substrate.

It follows that during said period, the power supply of the substrate is activated while the power supply of the plasma is deactivated, which corresponds to a relaxation stage.

During the implantation stage, the zones of the substrate that are electrically insulating become positively charged in cumulative manner. It goes without saying that this situation is undesirable, if only because of the disturbances it applies to the implantation process. It is therefore desirable to neutralize these positive charges by supplying electrons.

It is also possible to make provision for a filament, but that tends to vaporize. It is also possible to make provision for an electron gun, but that constitutes additional equipment that is relatively expensive.

It is therefore appropriate to facilitate neutralizing positive charges.

Thus, document WO 2013/057390 relates to a method of controlling an ion implanter that includes a plasma power supply and a substrate power supply, the substrate power supply comprising:

an electricity generator having its positive pole connected to ground;
a first switch having its first pole connected to the negative pole of the generator, and having its second pole connected to the output terminal of the substrate power supply; and
a second switch having its first pole connected to this output terminal, and having its second pole connected to a neutralization terminal;
which method includes an implantation stage during which:
the plasma power supply is activated;
the first switch is closed; and
the second switch is open;
the method also including a neutralization stage during which:
the first switch is open; and
the second switch is closed;
the method also including a relaxation stage during which:
the plasma power supply is inactivated.

The neutralization stage has a preliminary step for closing the second switch, which preliminary step is followed by a canceling step in order to activate the plasma power supply.

Thus, during the canceling step, the positive charges on the substrate are neutralized by the electrons of the plasma.

Most of the above-mentioned undesirable side effects are thus significantly reduced, if not eliminated.

Nevertheless, during plasma processes, in particular for plasmas of electronegative species (e.g. fluoride plasmas), dust is generated by an agglomeration mechanism. In that mechanism, a neutral atom of electronegative nature (e.g. a fluorine atom) captures an electron of the plasma in order to form a negative ion ($F^-$ in this example). Thereafter, this negative ion agglomerates with a positive ion so as to form a complex (a fluoride complex in this example) that in turn captures electrons from the plasma and become negatively charged, thereby attracting other positive ions, and thus growing in cumulative manner in the plasma so as to form dust. This growth comes to an end when the mass of the dust becomes considerable or else when the electromagnetic field generating the plasma ceases. The dust then drops under gravity onto the substrate that is being treated.

That agglomeration mechanism is well known and recourse is therefore had to a strategy of using pulsed plasmas that are associated with optimized gas flows, in particular when extinguishing the plasma. This makes it possible to reduce the size of the particles and to discharge them into the pumping system before they drop onto the substrate.

Nevertheless, that strategy is found to be insufficient with the ever-increasing miniaturization of electronic components. When implanting by plasma immersion, during negative voltage pulses, positive ions of the plasma are accelerated towards the substrate in order to be implanted therein. During these pulses, the substrate is subjected to a large flux of positive charges and its surface can become positively charged, particularly if it includes non-conductive materials such as oxides, nitrides, or photolithographic resin. In order to avoid excessive accumulation of positive charges that might lead to arcing phenomena, the plasma needs to be kept ignited for a certain length of time (several tens of microseconds (µs)) after the end of the negative pulse. Positive surface charges are then neutralized by electrons coming from the plasma. Such neutralization can even be improved by applying a positive potential to the substrate between negative pulses.

Nevertheless, if electrons are attracted to the substrate, then the same applies to negatively charged particles, so they accumulate on the surface of the substrate.

Incidentally, document FR 2 998 707 also discloses the characteristics of a control method for plasma immersion implanting. That document also makes provision for an initialization stage during which the substrate is negatively biased and the plasma power supply is off. Nevertheless, that initialization stage has a duration shorter than 5 µs.

That duration is much too short to eliminate the negatively charged particles.

SUMMARY OF THE INVENTION

An object of the present invention is thus to avoid such particles polluting the substrate.

According to the invention, a method of controlling an implanter operating in plasma immersion comprises:

an implantation stage during which the plasma is ignited and the substrate is negatively biased;
a neutralization stage during which the plasma is ignited and the substrate has a positive or zero bias applied thereto;
a suppression stage during which the plasma is extinguished; and
an expulsion stage for expelling negatively charged particles from the substrate and during which the plasma is extinguished;
which method is remarkable in that the duration of the expulsion stage is longer than 5 µs Advantageously, after the expulsion stage, the method includes a preparation stage during which the plasma is extinguished and the substrate has a positive or negative bias applied thereto.

Preferably, during the expulsion stage, the substrate is negatively biased.

Optionally, the implanter includes a recovery electrode arranged at the periphery of the substrate, and during the expulsion stage the electrode is positively biased.

In a preferred implementation, during the suppression stage, the substrate has a positive or negative bias applied thereto.

The invention also provides a bias power supply for an implanter, which power supply comprises:

a first electricity generator having its positive pole connected to ground;
a first switch having its first pole connected to the negative pole of the first generator, and having its second pole connected to the output terminal of the power supply; and
a second switch having its first pole connected to a compensation terminal, and having its second pole connected to the output terminal;
which power supply is remarkable in that it includes a third switch having its first pole connected to the negative pole of an auxiliary generator, and its second pole connected to the output terminal, the positive pole of the auxiliary generator being connected to a link terminal.

Optionally, the link terminal is connected to ground.

Alternatively, the implanter includes a recovery electrode, and the link terminal is connected to the recovery electrode.

In a first option, the compensation terminal is connected to ground.

In a second option, the compensation terminal is connected to the positive pole of a second generator, the negative pole of the second generator being connected to ground.

BRIEF DESCRIPTION OF THE DRAWINGS

The present invention appears below in greater detail from the following description of embodiments and implementations given by way of illustration and with reference to the accompanying figures, in which.

Elements present in more than one of the figures are given the same references in each of them.

DETAILED DESCRIPTION OF THE INVENTION

Figure 1:
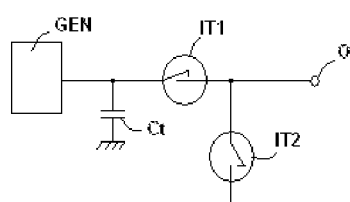
FIG. 1 shows a high voltage power supply of the prior art.
Figure 2:
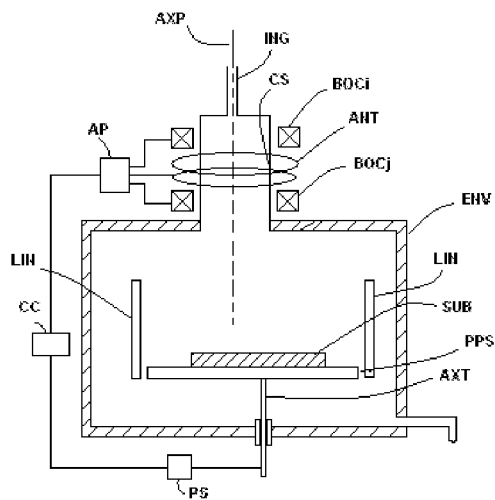
FIG. 2 shows an ion implanter provided with a control module.

With reference to FIG. 2, an ion implanter comprises a plurality of elements arranged inside and outside a vacuum enclosure ENV. For microelectronic applications, it is recommended to use an enclosure made of aluminum alloy if it is desired to limit contamination by metallic elements such as iron, chromium, nickel, or cobalt. It is also possible to use a coating of silicon or of silicon carbide.

A substrate carrier turntable PPS, in the form of a disk in a horizontal plane that is movable about its vertical axis AXT receives the substrate SUB that is to be subjected to ion implantation.

In the proximity of the substrate SUB, there is a recovery electrode such as a ring that is coaxial around the substrate SUB. This electrode may also be in the form of protective liner plates LIN arranged vertically at the periphery of the substrate SUB in order to protect the enclosure ENV.

The top portion of the enclosure ENV receives the body of the plasma source CS that is cylindrical about a vertical axis AXP. The body is made of quartz. It is surrounded on the outside firstly by confinement coils BOCi, BOCj, and secondly by an external radiofrequency antenna ANT. The plasma-generating gas input ING lies on the vertical axis AXP of the source body CS.

This vertical axis AXP encounters the surface of the substrate carrier turntable PPS on which the substrate SUB for implanting is arranged.

It is possible to use any type of pulsed plasma source: discharge; inductively coupled plasma (ICP); helicon; microwaves, arc. These sources can operate at pressure levels that are low enough for the electric field created between the high voltage turntable PPS and the grounded enclosure ENV not to ignite a discharge plasma which would disturb the pulsed operation of the source.

The control module of the ion implanter essentially comprises three elements:
a substrate power supply PS for supplying high voltage to the substrate SUB;
a plasma power supply AP for powering the radiofrequency antenna ANT and the confinement coils BOCi, BOCj (the term "power supply" is used broadly herein since naturally there is one power supply for the antenna and at least one distinct power supply for the coils); and
a control circuit CC for controlling these two power supplies.

Figure 3:
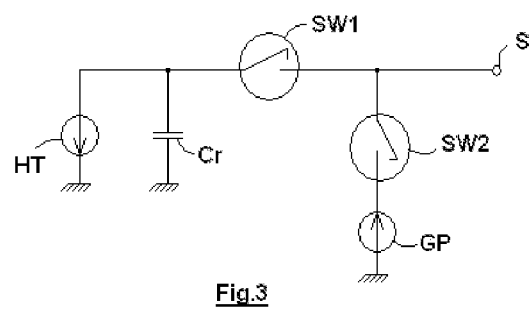
FIG. 3 shows a first embodiment of a high voltage electrical power supply of the invention.

With reference to FIG. 3, the substrate power supply PS comprises:
a first high voltage generator HT having its positive pole connected to ground;
a first switch SW1 having its first pole connected to the negative pole of the first generator HT and having its second pole connected to the output terminal S of the power supply;
a second switch SW2 having its first pole connected to the output terminal S, and having its second pole connected to the positive pole of a second generator GP;
the second generator GP having its negative pole connected to ground; and
preferably, a regulator capacitor Cr connected in parallel with the first generator HT.

The output terminal S is connected to the substrate carrier turntable PPS of the implanter.

The positive voltage from the second generator GP generally lies in the range 0 to 100 volts (V), and it is advantageously selected to be substantially equal to the plasma potential, which often lies in the range +10 V to +20 V.

Figure 4:
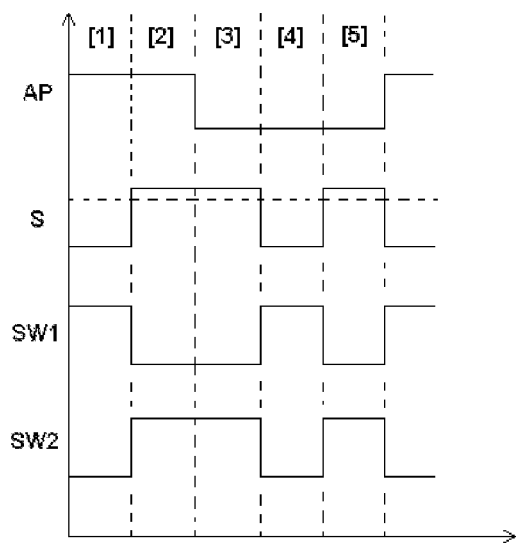
FIG. 4 is a timing diagram showing the method of the invention for this first embodiment.

With reference to FIG. 4, the control circuit CC controls the plasma power supply AP and the two switches SW1, SW2 of the substrate power supply PS as follows.

At the beginning of the cycle, the implantation stage [1] takes place:
the plasma power supply AP is on;
the first switch SW1 is closed; and
the second switch SW2 is open.

This implantation stage typically has a duration lying in the range 5 μs to 100 μs.

Following the implantation stage, there is a utilization stage [2]:
the plasma power supply AP is still on;
the first switch SW1 is open; and
the second switch SW2 is closed.

The electrons of the plasma are attracted by the positive surface potential so neutralization takes place. It should be observed at this point that it is possible to eliminate the second generator GP, in which case the second switch SW2 is connected to ground. This neutralization stage has a typical duration lying in the range 50 μs to 200 μs.

There follows a suppression stage [3]:
the plasma power supply AP is now inhibited;
the first switch SW1 remains open; and
the second switch SW2 remains closed.

This suppression stage has a typical duration in the range 50 μs to 200 μs.

After this suppression stage, there follows an expulsion stage [4]:
the plasma power supply AP is still inhibited;
the second switch SW2 opens; and negatively charged particles are expelled by means of one or the other or both of the following two operations:
  closing the first switch SW1; and/or
  connecting the recovery electrode LIN to a positive voltage (connection not shown in the figure).

The negative particles that have accumulated on the surface of the substrate SUB are expelled by the electrostatic effect. This expulsion stage has a typical duration lying in the range 5 µs to 100 µs.

If the recovery electrode LIN is positively biased, it accumulates these particles and it can dump them once it is no longer biased, at the risk of contaminating the substrate once again. It is therefore prudent to provide a period for cleaning the electrode. By way of example, the positive bias is stopped and it is even possible that a negative bias is applied in the presence of a strong flow of gas so that the particles are evacuated via the pumping system. This cleaning operation must naturally take place outside any implantation treatment, e.g. between treating two substrates or two batches or indeed when performing maintenance on the implanter.

Thereafter, there operationally follows a fifth stage referred to as the preparation stage [5]:
  the plasma power supply AP is still inhibited;
  the first switch SW1 is open; and
  the second switch SW2 is closed.

This preparation stage has a typical duration lying in the range 50 µs to 200 µs.

By way of example, the above method is used to implant boron by means of a $BF_3$ plasma on a silicon substrate having a diameter of 300 millimeters (mm). The negative bias voltage HT is equal to 2 kV. The implanted dose is $10^{16}/cm^2$.

Under such conditions, the number of particles of diameter greater than 65 nanometers (nm) on the substrate lies in the range 1 to 8. Without using this method, the number of particles of diameter greater than 65 nm present on the substrate would lie in the range 30 to 1000.

It is nevertheless possible that the plasma might be ignited by discharge during the expulsion stage [4]. This situation can be improved by modifying the substrate power supply PS somewhat.

Figure 5:
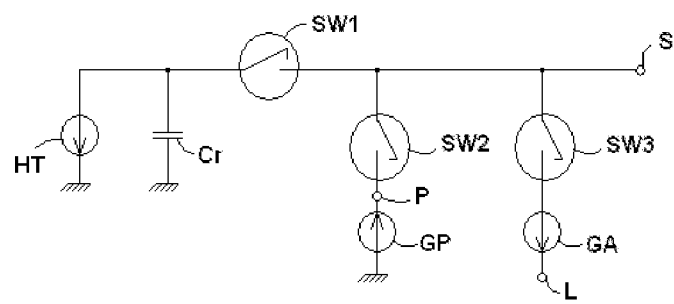
FIG. 5 shows a second embodiment of a high voltage electrical power supply of the invention.

With reference to FIG. 5, the substrate power supply PS comprises:
  a first high voltage generator HT having its positive pole connected to ground;
  a first switch SW1 having its first pole connected to the negative pole of the first generator HT, and having its second pole connected to the output terminal S of this power supply;
  a second switch SW2 having its first pole connected to the output terminal S, and having its second pole connected to a compensation terminal P;
  this compensation terminal P is connected:
    either to ground (configuration not shown in the figure);
    or else to the positive pole of a second generator GP (as shown in the figure);
  the second generator GP has its negative pole connected to ground;
  a third switch SW3 has its first pole connected to the output terminal S, and has its second pole connected to the negative pole of an auxiliary generator GA;
  the auxiliary generator GA has its positive pole connected to a link terminal L that is connected to ground, or possibly to the recovery electrode LIN; and
  preferably, a regulator capacitor Cr connected in parallel with the first generator HT.

The output terminal S is connected to the substrate carrier turntable PPS of the implanter.

The voltage of the auxiliary generator GA is less than the voltage of the first generator HT so as to avoid ignition in the enclosure.

Figure 6:
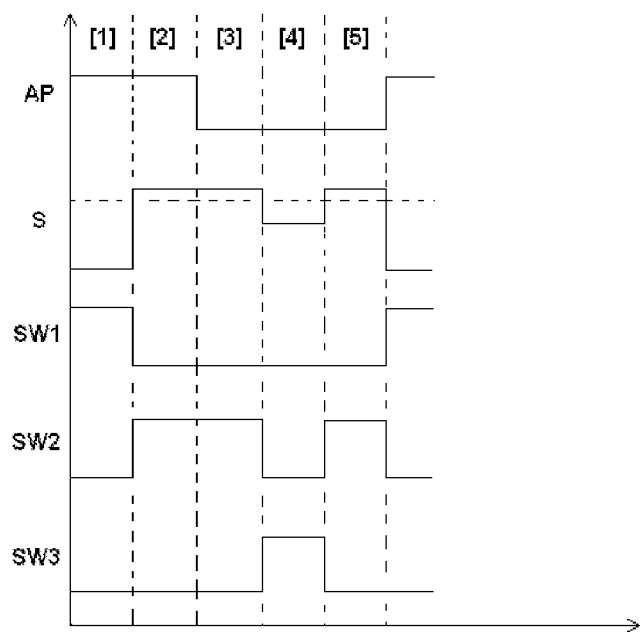
FIG. 6 is a timing diagram showing the method of the invention for this second embodiment.

With reference to FIG. 6, the method is then modified as follows.

At the beginning of a cycle, the implantation stage [1] takes place:
  the plasma power supply AP is on;
  the first switch SW1 is closed;
  the second switch SW2 is open; and
  the third switch SW3 is open.

This implantation stage has a typical duration lying in the range 5 µs to 100 µs.

After this implantation stage, there follows a neutralization stage [2]:
  the plasma power supply AP is still on;
  the first switch SW1 is open;
  the second switch SW2 is closed; and
  the third switch SW3 is open.

This neutralization stage has a typical duration lying in the range 50 µs to 200 µs.

There follows a suppression stage [3]:
  the plasma power supply AP is now inhibited;
  the first switch SW1 remains open;
  the second switch SW2 remains closed; and
  the third switch SW3 remains open.

This suppression stage has a typical duration lying in the range 50 µs to 200 µs.

After this suppression stage, there follows an expulsion stage [4]:
  the plasma power supply AP is still inhibited;
  the first switch SW1 remains open;
  the second switch SW2 opens; and
  the third switch SW3 closes, and optionally the recovery electrode LIN is connected to a positive voltage (connection not shown in the figure), e.g. to the positive pole of the auxiliary generator GA.

The substrate is once more negatively biased, but without plasma. This expulsion stage has a typical duration lying in the range 5 µs to 100 µs.

Thereafter, there necessarily follows a fifth stage referred to as the "preparation" stage [5]:
  the plasma power supply AP is still inhibited;
  the first switch SW1 remains open;
  the second switch SW2 closes; and
  the third switch SW3 opens.

This preparation stage has a typical duration lying in the range 50 µs to 200 µs.

The implementations of the invention described above have been selected because they are concrete in nature. Nevertheless, it is not possible to list exhaustively all possible implementations covered by the invention. In particular, any step or any means described may be replaced by an equivalent step or by equivalent means without going beyond the ambit of the present invention.

The invention claimed is:
1. A power supply for biasing an implanter, the power supply comprising:
  a first electricity generator having its positive pole connected to ground;
  a first switch having its first pole connected to the negative pole of said first generator, and having its second pole connected to the output terminal of the power supply; and a second switch having its first pole connected to a compensation terminal, and having its second pole connected to said output terminal;

the power supply being characterized in that it includes a third switch having its first pole connected to the negative pole of an auxiliary generator, and its second pole connected to the output terminal, the positive pole of said auxiliary generator being connected to a link terminal.

2. A power supply according to claim 1, characterized in that said link terminal is connected to ground.

3. A power supply according to claim 1, characterized in that the implanter includes a recovery electrode, and said link terminal is connected to the recovery electrode.

4. A power supply according to claim 1, characterized in that said compensation terminal is connected to ground.

5. A power supply according to claim 1, characterized in that said compensation terminal is connected to the positive pole of a second generator, the negative pole of the second generator being connected to ground.

* * * * *